(12) United States Patent
Li et al.

(10) Patent No.: US 10,692,895 B2
(45) Date of Patent: Jun. 23, 2020

(54) ARRAY SUBSTRATES, DISPLAY PANELS, AND DISPLAY APPARATUSES

(71) Applicant: BOE TECHNOLOGY GROUP CO., LTD., Beijing (CN)

(72) Inventors: Pan Li, Beijing (CN); Hongfei Cheng, Beijing (CN); Jianbo Xian, Beijing (CN); Yong Qiao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 356 days.

(21) Appl. No.: 15/750,831

(22) PCT Filed: Jul. 17, 2017

(86) PCT No.: PCT/CN2017/093152
§ 371 (c)(1),
(2) Date: Feb. 6, 2018

(87) PCT Pub. No.: WO2018/064904
PCT Pub. Date: Apr. 12, 2018

(65) Prior Publication Data
US 2020/0091192 A1    Mar. 19, 2020

(30) Foreign Application Priority Data
Oct. 8, 2016  (CN) .................... 2016 2 1104418 U (51) Int. Cl.
*H01L 29/04* (2006.01)
*H01L 29/10* (2006.01)
(Continued)

(52) U.S. Cl.
CPC ........ *H01L 27/124* (2013.01); *H01L 27/1262* (2013.01)

(58) Field of Classification Search
CPC ........... H01L 2021/775; H01L 27/1214; H01L 27/1229; H01L 27/1233; H01L 27/1237;
(Continued)

(56) References Cited

U.S. PATENT DOCUMENTS

2006/0018065 A1    1/2006  Hsu et al.
2012/0007080 A1*   1/2012  Liu ..................... H01L 27/1255
                                                            257/59
(Continued)

FOREIGN PATENT DOCUMENTS

CN    101369586 A    2/2009
CN    103941908 A    7/2014
(Continued)

OTHER PUBLICATIONS

English Translation of International Search Report & Box V of Written Opinion, for PCT Patent Application No. PCT/CN2017/093152, dated Oct. 19, 2017, 9 pages.

*Primary Examiner* — Calvin Y Choi
(74) *Attorney, Agent, or Firm* — Kinney & Lange, P.A.

(57) ABSTRACT

The present disclosure discloses an array substrate, a display panel, and a display apparatus. The array substrate includes a first signal line and a second signal line as well as a first TFT and a second TFT electrically connected to the first signal line and the second signal line. The first TFT has a gate located on its first conductive layer, a source located on its second conductive layer which is connected to the first conductive layer through a first via hole, and a drain located on a fourth conductive layer of the second TFT. The second TFT has a gate located on its third conductive layer, a drain located on the second conductive layer of the first TFT, and a source located on its fourth conductive layer which is connected to the third conductive layer through a second via hole.

20 Claims, 6 Drawing Sheets

(51) Int. Cl.
*H01L 31/00* (2006.01)
*H01L 27/12* (2006.01)

(58) Field of Classification Search
CPC .............. H01L 27/1251; H01L 27/3248; H01L 27/124; H01L 27/1262
USPC .......................................................... 257/59
See application file for complete search history.

(56) References Cited

U.S. PATENT DOCUMENTS

| | | | |
|---|---|---|---|
| 2013/0214279 A1* | 8/2013 | Nishimura | G06F 3/0412 257/59 |
| 2014/0036188 A1* | 2/2014 | Chen | G02F 1/136286 349/43 |
| 2015/0177859 A1 | 6/2015 | Zhou et al. | |

FOREIGN PATENT DOCUMENTS

| | | |
|---|---|---|
| CN | 105810677 A | 7/2016 |
| CN | 206179862 U | 5/2017 |

* cited by examiner

Fig. 7

ARRAY SUBSTRATES, DISPLAY PANELS, AND DISPLAY APPARATUSES

CROSS-REFERENCE TO RELATED APPLICATION(S)

This application is a U.S. National Stage Application of PCT International Application No. PCT/CN2017/093152, filed on Jul. 17, 2017, entitled "ARRAY SUBSTRATES, DISPLAY PANELS, AND DISPLAY APPARATUSES," which claims priority to the Chinese Patent Application No. 201621104418.8, filed on Oct. 8, 2016, entitled "ARRAY SUBSTRATES, DISPLAY PANELS AND DISPLAY APPARATUSES," which are incorporated herein by reference in their entireties.

TECHNICAL FIELD

The present disclosure relates to an array substrate, a display panel, and a display apparatus.

BACKGROUND

Flat panel displays have been widely used due to their advantages such as a small size, low power consumption etc. A flat panel display comprises an array substrate. The array substrate has a plurality of pixel units and a plurality of signal lines provided thereon. The plurality of pixel units may be controlled by the plurality of signal lines to display a picture. During an operation of the array substrate, electrostatic charges are easily generated on the signal lines. When the electrostatic charges are accumulated to a certain extent, the pixel units cannot operate normally. Therefore, an antistatic structure needs to be provided on the array substrate to dissipate the electrostatic charges on the signal lines.

The antistatic structure is provided at an edge of the array substrate and comprises a short circuit ring and a plurality of antistatic circuits. Each of the antistatic circuits has one end connected to one signal line and the other end connected to the short circuit ring. When electrostatic charges on a certain signal line are accumulated to a certain extent, an antistatic circuit connected to the signal line is conducted. The electrostatic charges may flow into the short circuit ring through the antistatic circuit, and then conduct other antistatic circuits through the short circuit ring. Then, the electrostatic charges are dissipated to other signal lines through the other antistatic circuits. Thereby, the electrostatic charges generated on the signal line are dispersed and dissipated.

In a process of implementing the present disclosure, the inventor discovered that there are at least the following problems in the related art:

The antistatic structure comprises two portions, which are a short circuit ring and a plurality of antistatic circuits. In order to better dissipate the electrostatic charges, the short circuit ring is often configured to be wide, which results in a large layout area and a wide frame of the flat panel display.

SUMMARY

In one aspect, the embodiments of the present disclosure provide an array substrate, comprising:

a first signal line and a second signal line as well as a first Thin Film Transistor (sometimes abbreviated as TFT hereinafter) and a second TFT electrically connected to the first signal line and the second signal line;

wherein the first TFT comprises:

a first conductive layer and a second conductive layer which are electrically connected to each other through a first via hole and are at least partly overlapped with each other, wherein the first via hole is located in a first region where the second conductive layer is overlapped with the first conductive layer; and the second TFT comprises: a third conductive layer and a fourth conductive layer which are electrically connected to each other through a second via hole and are at least partly overlapped with each other, wherein the second via hole is located in a second region where the fourth conductive layer is overlapped with the third conductive layer;

wherein the first conductive layer is connected to the first signal line, and the third conductive layer is connected to the second signal line, wherein the first TFT has a gate located in the first conductive layer, a source located in the second conductive layer, and a drain located in the fourth conductive layer, and wherein the second TFT has a gate located in the third conductive layer, a drain located in the second conductive layer, and a source located in the fourth conductive layer.

Optionally, the array substrate further comprises a first transparent conductive layer and a second transparent conductive layer, wherein the first transparent conductive layer covers a part of the second conductive layer and a part of the first conductive layer exposed in the first via hole to electrically connect the first conductive layer and the second conductive layer; and the second transparent conductive layer covers a part of the fourth conductive layer and a part of the third conductive layer exposed in the second via hole to electrically connect the third conductive layer and the fourth conductive layer.

Optionally, the first TFT has the source located at a first lead-out part of the second conductive layer and the drain located at a first lead-out part of the fourth conductive layer; and the second TFT has the drain located at a second lead-out part of the second conductive layer and the source located at a second lead-out part of the fourth conductive layer.

Optionally, a groove in a "2" shape is formed by one end of the second conductive layer and one end of the fourth conductive layer, so that two end faces are formed at one end of the second conductive layer and are parallel to the first signal line; and one of the two end faces which is closer to the first signal line is the first lead-out part, and the other of the two end faces is the second lead-out part.

Optionally, both the first lead-out part and the second lead-out part of the second conductive layer and both the first lead-out part and the second lead-out part of the fourth conductive layer have a sharp point structure.

Optionally, the array substrate further comprises a gate insulating layer formed on the first conductive layer and the third conductive layer.

Optionally, the array substrate further comprises:

a first active layer of the first TFT and a second active layer of the second TFT which are formed on the gate insulating layer.

Optionally, the array substrate further comprises a common electrode line, wherein the common electrode line is electrically connected to a signal line which is closest to the common electrode line through a TFT.

Optionally, the first conductive layer has the same width as that of the second conductive layer, and both a width direction of the first conductive layer and a width direction of the second conductive layer are parallel to the first signal line.

Optionally, the array substrate further comprises a passivation layer formed on the second conductive layer and the fourth conductive layer.

Optionally, the first via hole is formed in the gate insulating layer located on the first conductive layer between the first signal line and the second signal line, and formed in the second conductive layer and the passivation layer located on the gate insulating layer to expose a part of the first conductive layer, and the second via hole is formed in the gate insulating layer located on the third conductive layer between the first signal line and the second signal line, and formed in the fourth conductive layer and a passivation layer located on the gate insulating layer to expose a part of the third conductive layer.

In another aspect, the embodiments of the present disclosure provide a display panel comprising the array substrate described above.

In another aspect, the embodiments of the present disclosure provide a display apparatus comprising the display panel described above.

BRIEF DESCRIPTION OF THE DRAWINGS

In order to describe the technical solutions in the embodiments of the present disclosure more clear, the accompanying drawings required for describing the embodiments will be described below in brief. Obviously, the accompanying drawings in the following description are merely some embodiments of the present disclosure. Other accompanying drawings can also be obtained by those of ordinary skill in the art according to these accompanying drawings without any creative work.

DETAILED DESCRIPTION

In order to make the purposes, technical solutions, and advantages of the present disclosure more clear, the embodiments of the present disclosure are further described in detail below in conjunction with the accompanying drawings.

Figure 1:
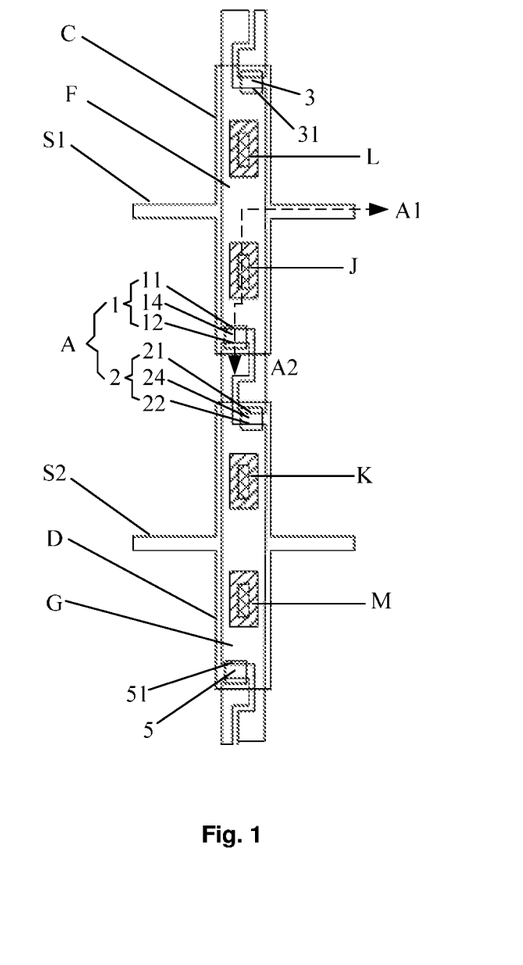
FIG. 1 is a structural diagram of a first antistatic circuit according to an embodiment of the present disclosure.
Figure 2:
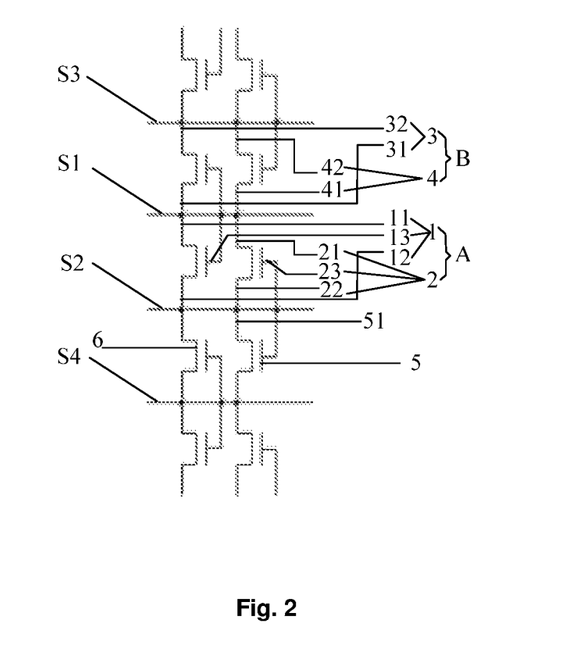
FIG. 2 is a circuit diagram of a first antistatic circuit according to an embodiment of the present disclosure.

As shown in FIG. 1 and with reference to FIG. 2, the embodiments of the present disclosure provide an array substrate, comprising:

a first signal line S1 and a second signal line S2 as well as a first TFT1 and a second TFT2 electrically connected to the first signal line S1 and the second signal line S2.

The first TFT1 comprises: a first conductive layer C and a second conductive layer F which are electrically connected to each other through a first via hole I and are at least partly overlapped with each other, wherein the first via hole I is located in a region where the first conductive layer C is overlapped with the second conductive layer F. The second TFT2 comprises: a third conductive layer D and a fourth conductive layer G which are electrically connected to each other through a second via hole Q and are at least partly overlapped with each other, wherein the second via hole Q is located in a region where the third conductive layer D is overlapped with the fourth conductive layer G.

The first conductive layer C is connected to the first signal line S1, and the third conductive layer D is connected to the second signal line S2; the first TFT1 has a gate 13 located in the first conductive layer C, a source 11 located in the second conductive layer F, and a drain 12 located in the fourth conductive layer G; and the second TFT2 has a gate 23 located in the third conductive layer D, a drain 21 located in the second conductive layer F, and a source 22 located in the fourth conductive layer G.

The first conductive layer C has the same or substantially the same width as that of the second conductive layer F, and both a width direction of the first conductive layer C and a width direction of the second conductive layer F are parallel to the first signal line S1. The third conductive layer D has the same or substantially the same width as that of the fourth conductive layer G, and both a width direction of the third conductive layer D and a width direction of the fourth conductive layer G are parallel to the second signal line S2.

In the array substrate according to the embodiments of the present disclosure, a first TFT1 and a second TFT2 are provided between any two adjacent signal lines. The first TFT1 is connected to the first signal line S1 and the second signal line S2, and the second TFT2 is also connected to the first signal line S1 and the second signal line S2. When a large amount of electrostatic charges are generated on the first signal line S1, as the gate 13 of the first TFT1 is connected to the first signal line S1, the first TFT1 is turned on to disperse the electrostatic charges onto the second signal line S2, and when a large amount of electrostatic charges are generated on the second signal line S2, as the gate 23 of the second TFT2 is connected to the second signal line S2, the second TFT2 is turned on to disperse the electrostatic charges onto the first signal line S1. As a result, the first TFT1 or the second TFT2 may dissipate a part of the electrostatic charges while dispersing the electrostatic charges onto a plurality of signal lines, so as to prevent accumulation of the electrostatic charges to achieve the purpose of dissipating the electrostatic charges. It is not necessary to provide a short circuit ring at an edge of the array substrate, which can achieve reduction of a width of a frame of the array substrate.

As shown in FIG. 2, the array substrate comprises multiple groups of adjacent signal lines. For example, the first signal line S1 is adjacent to the second signal line S2, a third signal line S3 is adjacent to the first signal line S1, and a fourth signal line S4 is adjacent to the second signal line S2. TFTs are provided between every two adjacent signal lines. After a certain amount of electrostatic charges are accumulated on the first signal line S1, the TFTs located between the first signal line S1 and the second signal line S2 and TFTs located between the first signal line S1 and the third signal line S3 may dissipate a part of the electrostatic charges while dispersing the electrostatic charges onto the second signal line S2 and the third signal line S3. The process is continuously carried out, to disperse the electrostatic charges onto the fourth signal line S4 and another signal line adjacent to the third signal line S3, thereby dispersing and dissipating the electrostatic charges to prevent occurrence of a phenomenon that the electrostatic charges are accumulated.

Optionally, the array substrate further comprises a common electrode line. The common electrode line is located on the array substrate and may be provided in parallel to the signal lines on the array substrate. The common electrode line is connected to a signal line which is closest to the common electrode line through a TFT.

In order to ensure that the electrostatic charges generated on the signal lines can be better dissipated, the common electrode line and the signal line closest to the common electrode line can be connected through one TFT. When the electrostatic charges are dispersed onto the signal line, the electrostatic charges are dispersed through the TFT onto the common electrode line, which plays a role of better dissipation of the electrostatic charges.

Optionally, the signal lines comprise data lines or scanning lines.

Figure 3:
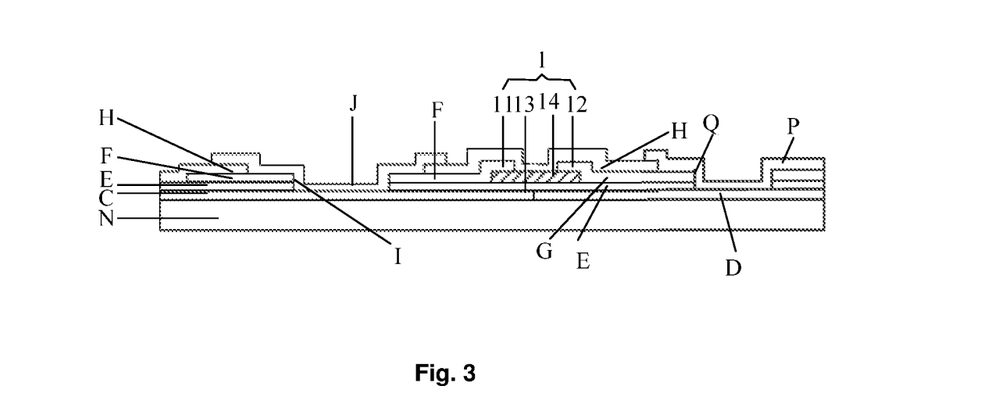
FIG. 3 is a sectional view of a first antistatic circuit according to an embodiment of the present disclosure along a line A1-A2.
Figure 4:
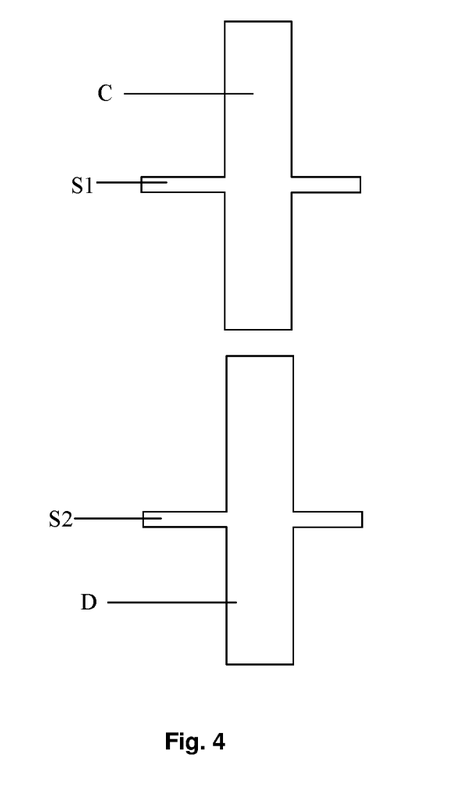
FIG. 4 is a structural diagram of a first conductive layer and a third conductive layer according to an embodiment of the present disclosure.

As shown in FIG. 1 and with reference to FIGS. 3 and 4, the first conductive layer C and the third conductive layer D may be formed on a glass substrate N.

The gate 13 of the first TFT1 and the first signal line S1 are located on the first conductive layer C, and the gate 23 of the second TFT2 and the second signal line S2 are located on the third conductive layer D.

The first conductive layer C and the third conductive layer D are located on the same plane.

Shapes of the first conductive layer C and the third conductive layer D may be formed by a patterning process, so that the first conductive layer C serves as both the first signal line S1 and the gate 13 of the first TFT1 and the third conductive layer D serves as both the second signal line S2 and the gate 23 of the second TFT2.

Optionally, the first conductive layer C and the third conductive layer D may be formed simultaneously by one patterning process.

The first conductive layer C located between the first signal line S1 and the second signal line S2 is used to form the gate 13 of the first TFT1 and a first conductive layer C located between the first signal line S1 and the third signal line S3 is used to form a gate of a third TFT3. Similarly, the third conductive layer D is used to form the gate 23 of the second TFT2 and a gate of a fifth TFT5, respectively.

After the gate 13 of the first TFT1 and the gate 23 of the second TFT2 are formed, a pattern of the gate insulating layer E is formed on the first conductive layer C and the third conductive layer D, a pattern of the first active layer 14 of the first TFT1 and a pattern of the second active layer 24 of the second TFT2 are formed on the gate insulating layer E, then the source 11 and the drain 12 of the first TFT1 are formed on the first active layer 14 and the source 22 and the drain 21 of the second TFT2 are formed on the second active layer 24.

Optionally, the source 11 and the drain 12 of the first TFT1 and the source 22 and the drain 21 of the second TFT2 may be formed in the following structure.

Figure 5:
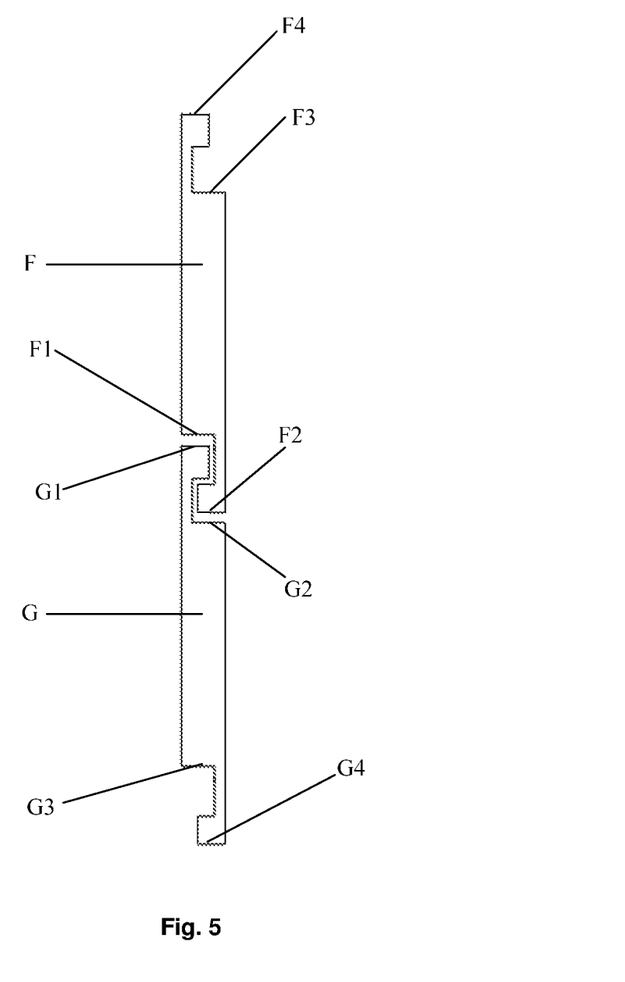
FIG. 5 is a structural diagram of a second conductive layer and a fourth conductive layer according to an embodiment of the present disclosure.

As shown in FIG. 1 and with reference to FIGS. 3 and 5, patterns of the second conductive layer F and the fourth conductive layer G are formed by a patterning process.

The source 11 of the first TFT1 is located at a first lead-out part F1 of the second conductive layer F, and the drain 12 of the first TFT1 is located at a first lead-out part G1 of the fourth conductive layer G.

The drain 21 of the second TFT2 is located at a second lead-out part F2 of the second conductive layer F, and the source 22 of the second TFT2 is located at a second lead-out part G2 of the fourth conductive layer G.

The second conductive layer F is connected to the first signal line S1 and the fourth conductive layer G is connected to the second signal line S2.

As shown in FIG. 1 and with reference to FIGS. 3 and 5, the second conductive layer F comprises four lead-out parts, which are the first lead-out part F1, the second lead-out part F2, a third lead-out part F3 and a fourth lead-out part F4 respectively.

The fourth conductive layer G comprises four lead-out parts, which are the first lead-out part G1, the second lead-out part G2, a third lead-out part G3, and a fourth lead-out part G4 respectively.

The first lead-out part F1 and the second lead-out part F2 of the second conductive layer F and the first lead-out part G1 and the second lead-out part G2 of the fourth conductive layer G are located between the first signal line S1 and the second signal line S2. A part of the first lead-out part F1 of the second conductive layer F which is located at one end of the first active layer 14 forms the source 11 of the first TFT1 and a part of the first lead-out part G1 of the fourth conductive layer G which is located at the other end of the first active layer 14 forms the drain 12 of the first TFT1. A part of the second lead-out part F2 of the second conductive layer F which is located at one end of the second active layer 24 forms the drain 21 of the second TFT2, and a part of the second lead-out part G2 of the fourth conductive layer G which is located at the other end of the second active layer 24 forms the source 22 of the second TFT2.

Similarly, as shown in FIG. 1 and with reference to FIGS. 2 and 5, the third lead-out part F3 and the fourth lead-out part F4 of the second conductive layer F are located between the first signal line S1 and the third signal line S3. The third lead-out part F3 of the second conductive layer F is used to form a source 31 of the third TFT3 and the fourth lead-out part F4 of the second conductive layer F is used to form a drain 41 of a fourth TFT4. The third lead-out part G3 and the fourth lead-out part G4 of the fourth conductive layer G are located between the second signal line S2 and the fourth signal line S4. The third lead-out part G3 of the fourth conductive layer G is used to form a source 51 of the fifth TFT5, and the fourth lead-out part G4 of the fourth conductive layer G is used to form a drain of a sixth TFT6. This will not be repeated herein.

Optionally, with reference to FIG. 5, one end of the second conductive layer F and one end of the fourth conductive layer G form a groove in a "2" shape, so that two end faces are formed at one end of the second conductive layer F and are parallel to the first signal line S1, and two end faces are formed at one end of the fourth conductive layer G and are parallel to the second signal line S2.

One of the two end faces of the second conductive layer F which is closer to the first signal line S1 is the first lead-out part F1, and the other of the two end faces is the second lead-out part F2. One of the two end faces of the fourth conductive layer G which is closer to the second signal line S2 is the second lead-out part G2 and the other of the two end faces is the first lead-out part G1.

Optionally, as shown in FIG. 1 and with reference to FIGS. 3 and 5, the first lead-out part F1 of the second conductive layer F may be formed at one end of the first active layer 14, and in this case, the second conductive layer F is formed to have a step structure, or one end of the first lead-out part F1 of the second conductive layer F may contact with one end of the first active layer 14, and in this case, the second conductive layer F has a planar structure. The first lead-out part G1 of the fourth conductive layer G may be formed at the other end of the first active layer 14, and in this case, the fourth conductive layer G is formed to have a step structure, or one end of the first lead-out part G1 of the fourth conductive layer G may contact with the other end of the first active layer 14, and in this case, the fourth conductive layer G has a planar structure.

Optionally, as shown in FIG. 3, a pattern of a passivation layer H is formed on the second conductive layer F and the fourth conductive layer G to protect the source 11 and the drain 12 of the first TFT1 and the drain 21 and the source 22 of the second TFT2.

Optionally, the following structure may be formed so that the first TFT1 has the source 11 connected to the first signal line S1 and the drain 12 connected to the second signal line S2, and the second TFT2 has the drain 21 connected to the first signal line S1 and the source 22 connected to the second signal line S2.

As shown in FIG. 1 and with reference to FIG. 3, the first via hole I is formed in the gate insulating layer E located on the first conductive layer C between the first signal line S1 and the second signal line S2, and formed in the second conductive layer F and the passivation layer H located on the gate insulating layer E to expose a part of the first conductive layer C. The first via hole I may be formed by a patterning process. When the passivation layer H is etched by a patterning process, a part of the second conductive layer F is exposed, and then a first transparent conductive layer J is formed at the first via hole I, so that the first transparent conductive layer J covers the exposed first conductive layer C through the first via hole I and is connected to the exposed second conductive layer F. As the first signal line S1 is formed by the first conductive layer C and the source 11 of the first TFT1 is formed by the second conductive layer F, the source 11 of the first TFT1 may be connected to the first signal line S1 by connecting the second conductive layer F to the first conductive layer C through the first transparent conductive layer J. As the drain 21 of the second TFT2 is formed by the second conductive layer F, the drain 21 of the second TFT2 may be connected to the first signal line S1 by connecting the second conductive layer F to the first conductive layer C through the first transparent conductive layer J.

The second via hole Q is formed in the gate insulating layer E located on the third conductive layer D between the first signal line S1 and the second signal line S2, and formed in the fourth conductive layer G and a passivation layer located on the gate insulating layer E to expose a part of the third conductive layer D. The second via hole Q may be formed by a patterning process. When the passivation layer is etched by a patterning process, a part of the fourth conductive layer G is exposed, and then a second transparent conductive layer P is formed at the second via hole Q, so that the second transparent conductive layer P covers the exposed third conductive layer D through the second via hole Q and is connected to the exposed fourth conductive layer G. As the second signal line S2 is formed by the third conductive layer D and the source 22 of the second TFT2 is formed by the fourth conductive layer G, the source 22 of the second TFT2 may be connected to the second signal line S2 by connecting the fourth conductive layer G to the third conductive layer D through the second transparent conductive layer P. As the drain 12 of the first TFT1 is formed by the fourth conductive layer G, the drain 12 of the first TFT1 may be connected to the second signal line S2 by connecting the fourth conductive layer G to the third conductive layer D through the second transparent conductive layer P.

Similarly, a third via hole is formed on the second conductive layer F, a third transparent conductive layer is formed on the third via hole, and the source 31 of the third TFT3 is connected to the first signal line S1 by connecting the second conductive layer F to the first conductive layer C through the third transparent conductive layer. A fourth via hole is formed on the fourth conductive layer G, a fourth transparent conductive layer is formed on the fourth via hole, and the source 51 of the fifth TFT5 is connected to the second signal line S2 by connecting the fourth conductive layer G to the third conductive layer D through the fourth transparent conductive layer.

The array substrate according to the embodiment of the present disclosure comprises a plurality of antistatic circuits. TFTs are provided between any two adjacent signal lines, and the TFTs are connected to the first signal line S1 and the second signal line S2. When a large amount of electrostatic charges are generated on the first signal line S1, the TFTs may disperse the electrostatic charges onto the second signal line S2, so that an antistatic circuit may dissipate a part of the electrostatic charges while the electrostatic charges can be dispersed onto a plurality of signal lines, so as to prevent accumulation of the electrostatic charges to achieve the purpose of dissipating the electrostatic charges. It is not necessary to provide a short circuit ring at an edge of the array substrate, which can achieve reduction of a width of a frame of the array substrate.

More specifically, a first TFT and a second TFT are provided between any two adjacent signal lines. The first TFT is connected to the first signal line and the second signal line and a gate of the first TFT is connected to the first signal line, and the second TFT is connected to the first signal line and the second signal line and a gate of the second TFT is connected to the second signal line. Thereby, when a large amount of electrostatic charges are generated on the first signal line, the first TFT is turned on and disperses the electrostatic charges onto the second signal line, and when a large amount of electrostatic charges are generated on the second signal line, the second TFT is turned on and disperses the electrostatic charges onto the first signal line. As a result, the first TFT and the second TFT may dissipate a part of the electrostatic charges while dispersing the electrostatic charges onto a plurality of signal lines, which can prevent accumulation of the electrostatic charges to achieve the purpose of dissipating the electrostatic charges. It is not necessary to provide a short circuit ring at an edge of the array substrate, which can achieve reduction of a width of a frame of the array substrate.

Figure 6:
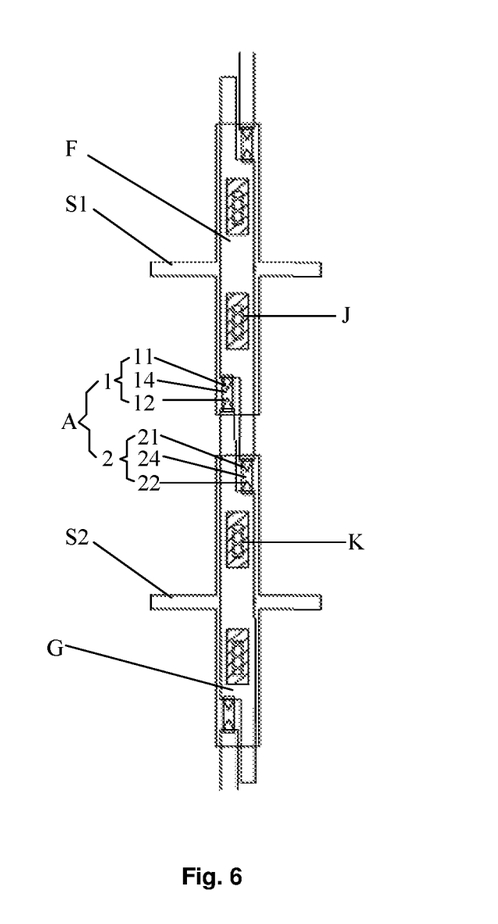
FIG. 6 is a structural diagram of a first antistatic circuit according to another embodiment of the present disclosure.
Figure 7:
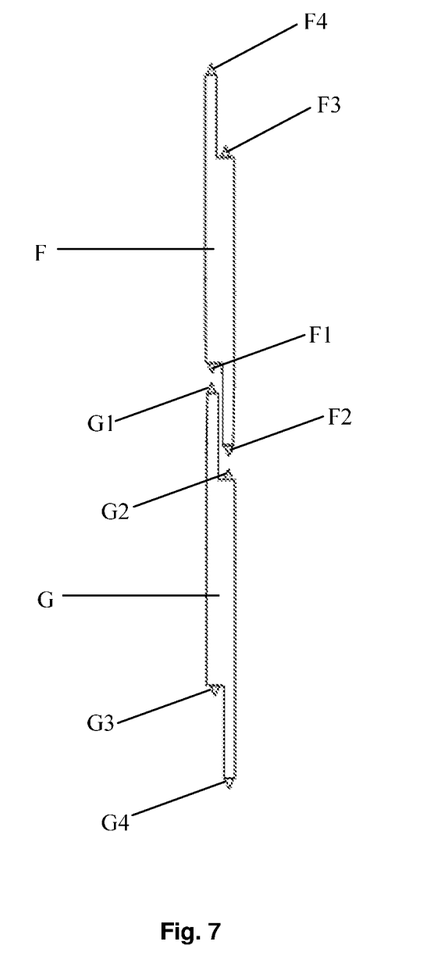
FIG. 7 is a structural diagram of a second conductive layer and a fourth conductive layer according to another embodiment of the present disclosure.

As shown in FIG. 6 and with reference to FIG. 7, another embodiment of the present disclosure provides an array substrate comprising a plurality of signal lines and TFTs located between any two adjacent signal lines of the plurality of signal lines.

For the any two adjacent signal lines, the any two adjacent signal lines are referred to as a first signal line S1 and a second signal line S2 respectively for convenience of illustration, and the TFTs connected between the first signal line S1 and the second signal line S2 are referred to as a first TFT and a second TFT.

Specific components included in the array substrate according to the present embodiment are the same as those included in the array substrate according to the above embodiment and will not be repeated here.

Compared with the above embodiment, the present embodiment differs in that the first lead-out part F1, the second lead-out part F2, the third lead-out part F3 and the fourth lead-out part F4 of the second conductive layer F as well as the first lead-out part G1, the second lead-out part G2, the third lead-out part G3 and the fourth lead-out part G4 of the fourth conductive layer G have a sharp point structure.

As a large amount of charges may be accumulated at a sharp point, the first lead-out part F1, the second lead-out part F2, the third lead-out part F3 and the fourth lead-out part F4 of the second conductive layer F as well as the first lead-out part G1, the second lead-out part G2, the third lead-out part G3 and the fourth lead-out part G4 of the fourth conductive layer G are designed to have a sharp point structure, so that a channel size corresponding to the sharp point structure can be smaller if the TFTs form the same current, thereby further reducing a size of a first antistatic circuit A, and reducing a size of an antistatic circuit located between any two adjacent signal lines.

In the array substrate according to the embodiment of the present disclosure, TFTs are provided between any two adjacent signal lines, and the TFTs are connected to the first signal line S1 and the second signal line S2. When a large amount of electrostatic charges are generated on the first signal line S1, the TFTs may disperse the electrostatic charges onto the second signal line S2, so that an antistatic circuit may dissipate a part of the electrostatic charges while the electrostatic charges can be dispersed onto a plurality of signal lines, so as to prevent accumulation of the electrostatic charges to achieve the purpose of dissipating the electrostatic charges. It is not necessary to provide a short circuit ring at an edge of the array substrate, which can achieve reduction of a width of a frame of the array substrate.

A further embodiment of the present disclosure provides a display panel, which comprises the array substrate described in any of the above embodiments.

A yet further embodiment of the present disclosure provides a display apparatus, which comprises the display panel described in the above embodiment.

In the array substrate according to the embodiment of the present disclosure, TFTs are provided between any two adjacent signal lines, and the TFTs are connected to the first signal line S1 and the second signal line S2. When a large amount of electrostatic charges are generated on the first signal line S1, the TFTs may disperse the electrostatic charges onto the second signal line S2, so that an antistatic circuit may dissipate a part of the electrostatic charges while the electrostatic charges can be dispersed onto a plurality of signal lines, so as to prevent accumulation of the electrostatic charges to achieve the purpose of dissipating the electrostatic charges. It is not necessary to provide a short circuit ring at an edge of the array substrate, which can achieve reduction of a width of a frame of the array substrate.

The serial numbers of the foregoing embodiments of the present disclosure are merely for description and do not represent preferred embodiments and non-preferred embodiments.

The above description is only the preferred embodiments of the present disclosure and is not intended to limit the present disclosure. Any modifications, equivalent substitutions, improvements, etc. within the spirit and principle of the disclosure should be included in the protection scope of the present disclosure.

We claim:

1. An array substrate, comprising:
   a first signal line;
   a second signal line;
   a first Thin Film Transistor (TFT) electrically connected to the first signal line and the second signal line; and
   a second TFT electrically connected to the first signal line and the second signal line;
   wherein the first TFT comprises:
      a first conductive layer; and
      a second conductive layer configured to be electrically connected to the first conductive layer through a first via hole and to be at least partly overlapped with the first conductive layer, wherein the first via hole is located in a first region where the second conductive layer is overlapped with the first conductive layer; and
   wherein the second TFT comprises:
      a third conductive layer; and
      a fourth conductive layer configured to be electrically connected to the third conductive layer through a second via hole and to be at least partly overlapped with the third conductive layer, wherein the second via hole is located in a second region where the fourth conductive layer is overlapped with the third conductive layer;
   wherein the first conductive layer is connected to the first signal line, and the third conductive layer is connected to the second signal line,
   wherein the first TFT has a gate located in the first conductive layer, a source located in the second conductive layer, and a drain located in the fourth conductive layer, and
   wherein the second TFT has a gate located in the third conductive layer, a drain located in the second conductive layer, and a source located in the fourth conductive layer.

2. The array substrate according to claim 1, further comprising:
   a first transparent conductive layer configured to cover a part of the second conductive layer and a part of the first conductive layer exposed in the first via hole to electrically connect the first conductive layer and the second conductive layer; and
   a second transparent conductive layer configured to cover a part of the fourth conductive layer and a part of the third conductive layer exposed in the second via hole to electrically connect the third conductive layer and the fourth conductive layer.

3. The array substrate according to claim 2, wherein
   the first TFT has the source located at a first lead-out part of the second conductive layer and the drain located at a first lead-out part of the fourth conductive layer; and
   the second TFT has the drain located at a second lead-out part of the second conductive layer and the source located at a second lead-out part of the fourth conductive layer.

4. The array substrate according to claim 3, wherein
   a groove in a "2" shape is formed by one end of the second conductive layer and one end of the fourth conductive layer, so that two end faces are formed at the one end of the second conductive layer and are both parallel to the first signal line; and
   one of the two end faces which is closer to the first signal line is the first lead-out part, and the other of the two end faces is the second lead-out part.

5. The array substrate according to claim 3, wherein both the first lead-out part and the second lead-out part of the second conductive layer and both the first lead-out part and the second lead-out part of the fourth conductive layer have a sharp point structure.

6. The array substrate according to claim 1, further comprising a gate insulating layer formed on the first conductive layer and the third conductive layer.

7. The array substrate according to claim 6, further comprising:
   a first active layer of the first TFT and a second active layer of the second TFT which are formed on the gate insulating layer.

8. The array substrate according to claim 1, wherein the first conductive layer has the same width as that of the second conductive layer, and both a width direction of the first conductive layer and a width direction of the second conductive layer are parallel to the first signal line.

9. The array substrate according to claim 1, further comprising a passivation layer formed on the second conductive layer and the fourth conductive layer.

10. A display panel comprising the array substrate according to claim 1.

11. A display apparatus comprising the display panel according to claim 10.

12. The array substrate according to claim 6, wherein
the first via hole is formed in the gate insulating layer located on the first conductive layer between the first signal line and the second signal line, and is formed in the second conductive layer and the passivation layer located on the gate insulating layer to expose a part of the first conductive layer, and
the second via hole is formed in the gate insulating layer located on the third conductive layer between the first signal line and the second signal line, and is formed in the fourth conductive layer and a passivation layer located on the gate insulating layer to expose a part of the third conductive layer.

13. The display panel according to claim 10, wherein the array substrate further comprises:
a first transparent conductive layer configured to cover a part of the second conductive layer and a part of the first conductive layer exposed in the first via hole to electrically connect the first conductive layer and the second conductive layer; and
a second transparent conductive layer configured to cover a part of the fourth conductive layer and a part of the third conductive layer exposed in the second via hole to electrically connect the third conductive layer and the fourth conductive layer.

14. The display panel according to claim 13, wherein
the first TFT has the source located at a first lead-out part of the fourth conductive layer; and
the second TFT has the drain located at a second lead-out part of the second conductive layer and the source located at a second lead-out part of the fourth conductive layer.

15. The display panel according to claim 14, wherein
a groove in a "2" shape is formed by one end of the second conductive layer and one end of the fourth conductive layer, so that two end faces are formed at the one end of the second conductive layer and are both parallel to the first signal line; and
one of the two end faces which is closer to the first signal line is the first lead-out part, and the other of the two end faces is the second lead-out part.

16. The display panel according to claim 14, wherein both the first lead-out part and the second lead-out part of the second conductive layer and both the first lead-out part and the second lead-out part of the fourth conductive layer have a sharp point structure.

17. The display panel according to claim 10, wherein the array substrate further comprises a gate insulating layer formed on the first conductive layer and the third conductive layer.

18. The display panel according to claim 17, wherein the array substrate further comprises:
a first active layer of the first TFT and a second active layer of the second TFT which are formed on the gate insulating layer.

19. The display panel according to claim 10, wherein the first conductive layer has the same width as that of the second conductive layer, and both a width direction of the first conductive layer and a width direction of the first conductive layer and a width direction of the second conductive layer are parallel to the first signal line.

20. The display panel according to claim 10, wherein the array substrate further comprises a passivation layer formed on the second conductive layer and the fourth conductive layer.

* * * * *